United States Patent

Nishida

[11] Patent Number: 5,254,481
[45] Date of Patent: Oct. 19, 1993

[54] POLYCRYSTALLINE SOLAR CELL MANUFACTURING METHOD

[75] Inventor: Shoji Nishida, Fujisawa, Japan

[73] Assignee: Canon Kabushiki Kaisha, Tokyo, Japan

[21] Appl. No.: 794,462

[22] Filed: Nov. 19, 1991

[30] Foreign Application Priority Data

Nov. 20, 1990 [JP] Japan .................... 2-315084

[51] Int. Cl.5 ................... H01L 31/18; H01L 31/0368
[52] U.S. Cl. .......................... 437/4; 136/258;
437/89; 437/109; 437/967; 257/49
[58] Field of Search ............... 136/258 PC; 357/30 J,
357/30 K; 437/4, 89–92, 109, 967; 257/49

[56] References Cited

U.S. PATENT DOCUMENTS

| 3,953,876 | 4/1976 | Sirtl et al. | 437/2 |
| 3,990,914 | 11/1976 | Weinstein et al. | 136/246 |
| 4,042,447 | 8/1977 | Reitz | 156/610 |
| 4,187,126 | 2/1980 | Radd et al. | 437/17 |
| 4,463,028 | 7/1984 | Laude | 427/53.1 |
| 4,927,786 | 5/1990 | Nishida | 437/233 |
| 5,002,796 | 3/1991 | Nishida | 427/45.1 |
| 5,098,850 | 3/1992 | Nishida | 437/4 |

FOREIGN PATENT DOCUMENTS

| 2704339 | 8/1978 | Fed. Rep. of Germany | 136/258 PC |
| 63-182872 | 7/1988 | Japan | 136/258 PC |

Primary Examiner—Aaron Weisstuch
Attorney, Agent, or Firm—Fitzpatrick, Cella, Harper & Scinto

[57] ABSTRACT

A solar cell has a polycrystalline silicon layer formed on a metal substrate. The crystal orientation of the crystal grains of the silicon layer is regulated in the film thickness direction.

7 Claims, 7 Drawing Sheets

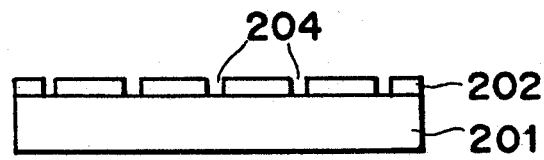
FIG. 1A
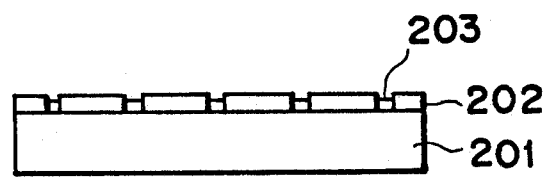
FIG. 1B
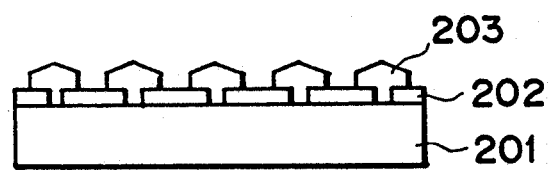
FIG. 1C
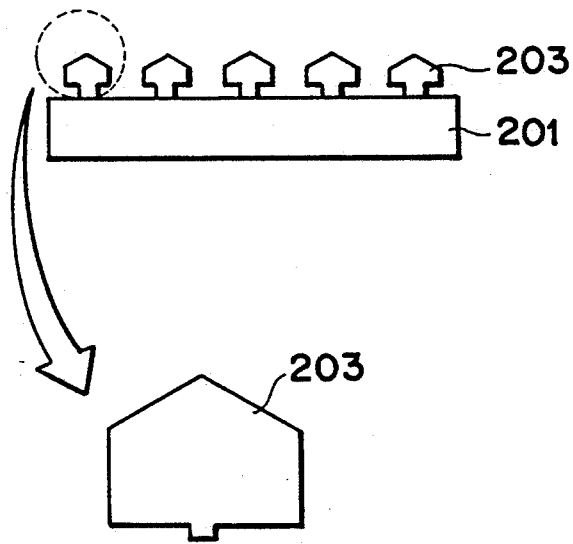
FIG. 1D
FIG. 1E

POLYCRYSTALLINE SOLAR CELL MANUFACTURING METHOD

BACKGROUND OF THE INVENTION

Field of the Invention

The present invention relates to a solar cell and the manufacturing method therefor. More particularly, the invention relates to a solar cell having an excellent energy conversion effect and the manufacturing method thereof.

Related Background Art

For various apparatus and devices, solar cells are now utilized as a driving energy source.

The solar cell uses a pn junction for its functional portion, and as a semiconductor which constitutes the pn junction, silicon is generally used. It is preferable to use single crystal silicon from the viewpoint of the efficiency of converting light energy into electromotive force. However, the use of amorphous silicon is considered advantageous from the viewpoint of obtaining a larger area cell at a lower cost.

In recent years the use of polycrystalline silicon has been studied for the purpose of attaining a cost as low as for the amorphous silicon and an energy conversion efficiency as high as for the single crystal silicon. However, a method which has been conventionally proposed uses polycrystalline silicon blocks sliced into plates. Therefore, it is difficult to obtain such a plate of less than 0.3 mm thick. This thickness is more than enough to absorb photon energy sufficiently, thus making it unable to provide cost effective utilization of the material. In other words, in order to lower the cost, it is necessary to obtain a plate which is much thinner.

To cope with the situation, the formation of polycrystalline silicon thin films has been attempted using a thin film fabrication technique such as the chemical vapor deposition method (CVD). However, the obtained crystal grains are only approximately several hundredths of a micron in diameter. As a result, its energy conversion efficiency is low, even as compared with the sliced polycrystalline silicon blocks.

Also, an attempt has been made to make the grains larger by irradiating a laser onto the polycrystalline thin film fabricated by the above-mentioned CVD method to melt it in order to be recrystallized. However, this is still costly and at the same time, it is difficult to stabilize the fabrication.

A situation such as this is a common problem existing not only with silicon but with compound semiconductors.

On the other hand, a method for manufacturing solar cells is disclosed in Japanese Patent Application Laid-Open No. 63-182872, wherein on the surface of a substrate, a material is provided which differs from the surface material of the substrate and has a sufficient nucleation density and is sufficiently fine so that only single crystal nuclei are grown, and then, a crystal growth process is applied to the aforesaid nuclei to form an essentially single crystal layer of a first conductivity type semiconductor on the aforesaid substrate surface as well as an essentially single crystal layer of a second conductivity type semiconductor over the first single crystal layer.

In the above-mentioned method, a crystal grain boundary (hereinafter referred to as grain boundary) is formed when the single crystals, which are grown from a plurality of the single nuclei formed on the nucleation surface, are in contact with each other.

Generally, in polycrystalline semiconductors, many single crystal grains having various crystal orientations form a number of grain boundaries between them, and atoms having non-coupling bonds exist in the grain boundary, thus forming defect levels in the forbidden band. The characteristics of a semiconductor device are closely related to the defect density of the semiconductor layers to be grown, and the aforesaid defect levels are formed in the grain boundary where impurities tend to be segregated, hence causing the device characteristics to be lessened. Therefore, it is conceivable that the device characteristics largely depend on control of the grain boundaries in the polycrystalline semiconductor. In other words, in order to improve the characteristics of a semiconductor device using polycrystals for the active semiconductor layer, it is effective to reduce the amount of the grain boundaries existing in the semiconductor layer. The objective of the above-mentioned method is to reduce the amount of the grain boundaries by increasing the grain diameter.

According to the conventional method for manufacturing solar cells, the crystal orientation of the single crystals themselves is irregular. As a result, even if the defect levels per unit volume can be reduced by increasing the grain diameter, there is not much difference on average in terms of the defect levels per unit area on the grain boundary plane to be formed. In contrast, if each crystal orientation of the growing directions of the single crystals themselves is regular, the defect level density on the grain boundary plane is small even when the single crystals themselves contact each other to form the grain boundaries, as compared with the case where the crystal orientation is irregular. However, no technique has been found to regulate the orientation of the individual crystals in the polycrystal.

SUMMARY OF THE INVENTION

An object of the present invention is to provide a high-quality solar cell and a method for manufacturing solar cells by regulating the orientations of the single crystals constituting a polycrystalline semiconductor and reducing the defect level density in the grain boundaries.

Another object of the present invention is to provide solar cells at a lower cost by transplanting single crystals formed in a silicon wafer onto a metal substrate to make them seed crystals.

According to the present invention, a solar cell having its silicon layer formed on a metal substrate is characterized in that the crystal orientations of the crystal grains in the silicon layer in the film thickness direction are regular.

Also, a solar cell according to the present invention is characterized in that a metal—silicon intermediate layer is provided between the aforesaid metal substrate and a part of the silicon layer.

A method for manufacturing solar cells according to the present invention comprises the steps of: forming a metal—silicon intermediate layer between the aforesaid metal substrate and single crystals of silicon by heating subsequent to arranging the single crystals of silicon with regulated crystal orientation at intervals on the metal substrate, oxidizing the exposed surface of the aforesaid metal substrate, and performing the crystal growth of the aforesaid single crystals of silicon as seed crystals by a selective epitaxial grown method.

Also, a method for manufacturing solar cells according to the present invention comprises the steps of: forming an insulating layer on the silicon wafer when the aforesaid single crystals of silicon are arranged on the aforesaid metal substrate, forming the single crystals of silicon by a selective epitaxial growth method subsequent to providing fine openings in a part of the aforesaid insulating layer, and removing the aforesaid single crystals of silicon from the silicon wafer by ultrasonic vibrations to arrange them on the metal substrate, subsequent to removing the aforesaid insulating layer by etching.

Further, a method for manufacturing solar cells according to the present invention is characterized in that ultrasonic vibrations are applied when the aforesaid single crystals of silicon are arranged on the aforesaid metal substrate.

The principal technique of the present invention comprises the steps of: performing the selective epitaxial growth using the non-nucleation surface formed on the silicon wafer shown in FIG. 1 and the silicon seed portion, growing the single crystals having regular crystal orientation and size (grain diameter) by selective epitaxial lateral over growth, transplanting the aforesaid single crystals as seed crystals onto the metal substrate after having removed the insulating layer, which is the non-nucleation surface, and forming a polycrystalline silicon thin film on the metal substrate performing the selective epitaxial growth of the transplanted crystals.

Now, the general principle of the selective epitaxial growth will be briefly described. The selective epitaxial growth method is a method for executing epitaxial growth using a silicon surface exposed in openings provided in an insulating layer as seed crystals under conditions such that crystal growth spreads over portions of the insulating layer, such as an oxide film formed on a silicon wafer as shown in FIGS. 1A and 1B when the epitaxial growth is executed by a vapor deposition method. In a case where the epitaxial layer filling the opening is grown continuously, the crystal layer grows in the lateral direction along the surface of the insulating layer while continuing its growth in the longitudinal direction. This is called an epitaxial lateral overgrowth. At this juncture, the growing ratio in the longitudinal and lateral directions and the appearance of facets generally depend on the formation conditions and the thickness of the insulating layer.

The inventor has discovered after many repeated experiments that by making the size of the openings fine, e.g. several μm or less, the crystals grow three dimensionally on the insulating layer with the growing ratio of the longitudinal and lateral directions being substantially one to one irrespective of the thickness of the insulating layer. Consequently, clear facets appear, so that angular single crystals can be obtained (FIG. 1 and FIG. 2).

Also, the inventor has discovered that the insulating film beneath portions of the single crystals can be removed by etching, and as a result thereof, the above-mentioned single crystals can be removed from the silicon wafer.

Furthermore, the inventor has discovered that in a case where the separated granular single crystals are arbitrarily spread over a flat plane, and a silicon wafer (100) is used, for example, the single crystals are adhered to on the plane surface with the vertical direction upwards so that mostly crystals with their <100> directions face upwards, e.g. shown in FIG. 3C. Based on these discoveries, the present invention has been completed.

BRIEF DESCRIPTION OF THE DRAWINGS

FIGS. 1A to 1E are views illustrating the selective crystal growing method;

DESCRIPTION OF THE PREFERRED EMBODIMENTS

Hereinafter, a description of the functions will be made in detail based on the experiments performed by the inventor hereof.

Experiment 1. Selective Crystal Growth

Figure 2A:
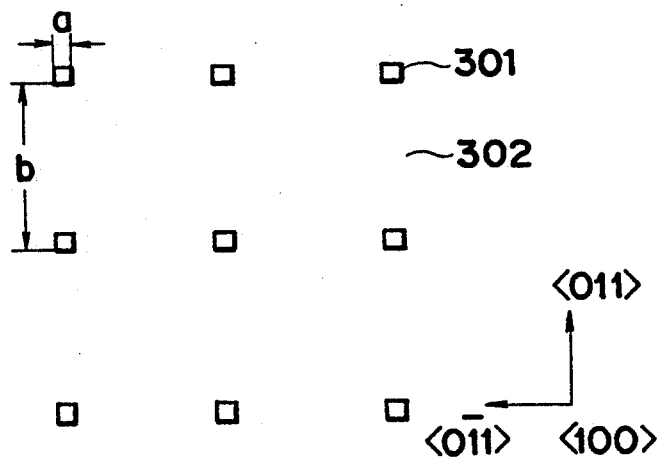
FIGS. 2A and 2B are views illustrating the process whereby the angular crystals obtainable by the present invention are grown three dimensionally.
Figure 4:
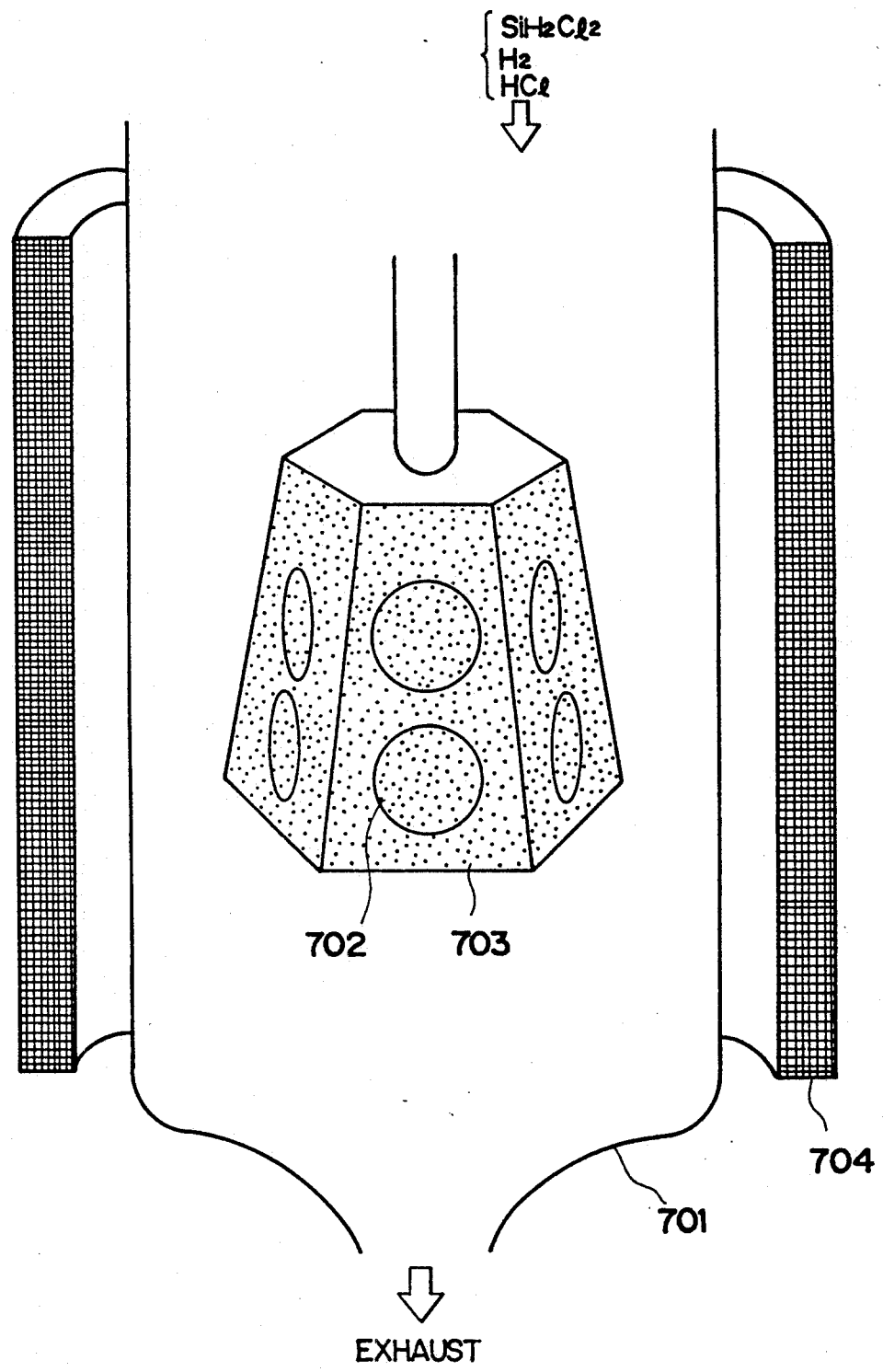
FIG. 4 is a view illustrating the structure of the LPCVD apparatus which is used for the selective crystal growth method.
Figure 5A:
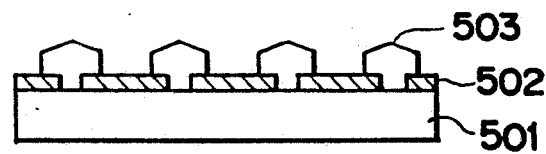
FIGS. 5A to 5F are views illustrating the manufacturing process of a hetero type solar cell fabricated by a method according to the present invention.
Figure 5B:
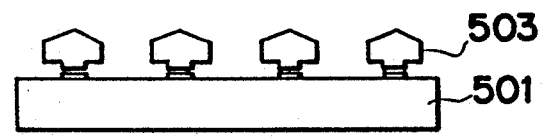
Figure 5C:
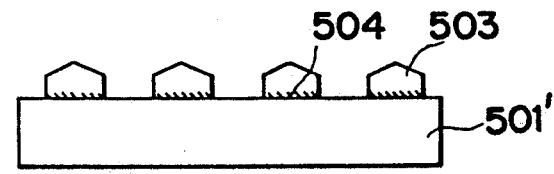
Figure 5D:
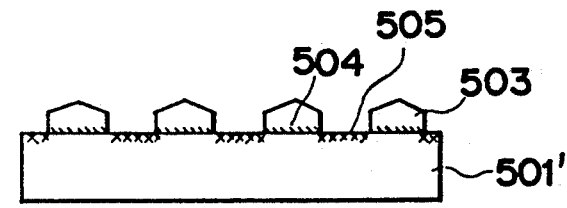
Figure 5E:
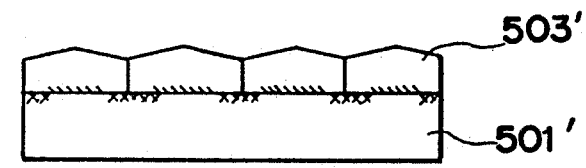
Figure 5F:
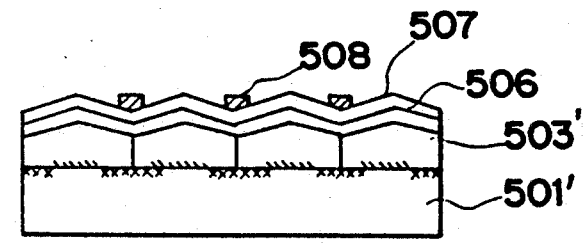

As shown in FIG. 1A, a 200-Å thermal oxidation film is formed as an insulating layer 202 on a 500-μm thick (100) silicon wafer 201 surface, and etching is performed using photolithography. Openings 204 each having one side a are provided at intervals b=50 μm in an arrangement as shown in FIG. 2A. In this respect, three different kinds of openings are provided, respectively having 1.2 μm, 2 μm, and 4 μm as its value for the side a. Then, using a conventional low pressure CVD apparatus (LPCVD) as shown in FIG. 4 (where 701 represents a quartz bell jar, 702 a concavely shaped wafer support, 703 a susceptor, and 704 a heater), the selective crystal growth is performed (FIG. 1B). As a raw material gas, $SiH_2Cl_2$ is used and as a carrier gas, and $H_2$ is added with a further addition of HCl in order to restrain the generation of nuclei on the oxidation film of the insulating layer 202. The growth conditions are given in Table 1 below.

TABLE 1

| | |
|---|---|
| Glass flow ratio (l/min) | $SiH_2Cl_2/HCl/H_2$ = 0.53/2.0/100 |
| Substrate temperature (°C.) | 1,030 |
| Pressure (Torr) | 80 |
| Growth time (min) | 20 |

Figure 2B:
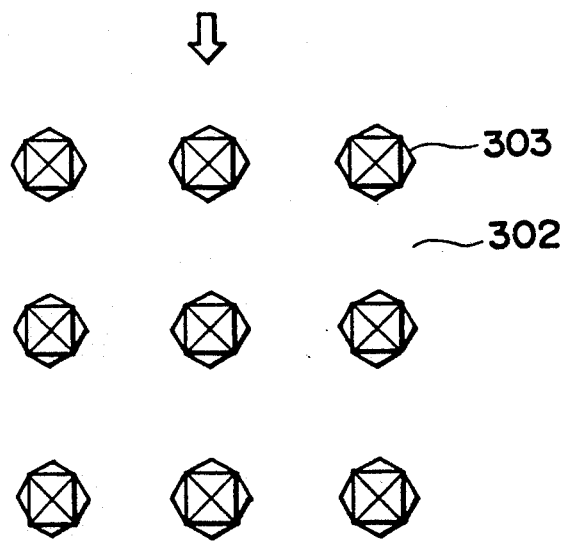

After the completion of the growth, the state of the wafer surface is observed by an optical microscope, with the result shown in FIG. 1C or FIG. 2B, wherein single crystals 203 (303) each having an angular facet with a granular diameter of approximately 20 μm are arranged regularly at intervals of 50 μm corresponding to spacing b, and it is confirmed that the selective crystal growth has been performed in accordance with the pattern of the openings 301 defined as in FIG. 2A. At this stage, the percent occupancy of the openings by the grown crystals is 100% for every value a. Also, among the grown crystals, the percent of those having a clear appearance of the surface facet depends on the value a, and as shown in Table 2, the smaller the value a, the less is the deformation percent.

TABLE 2

| a (μm) | 1.2 | 2 | 4 |
|---|---|---|---|
| Facet percentage | 96.4 | 93.1 | 84.6 |

The orientations of all the obtained single crystals are regular to each other, and it is clear that the crystal orientations have been accurately transferred thereto from the silicon wafer serving as the substrate.

Experiment 2. Removal of the Insulating Layer

The silicon wafer with the grown single crystals obtained in Experiment 1 is then immersed in a 49% HF solution for 24 hours. Then, after washing by flowing water, the wafer is dried and its surface is observed by an optical microscope and a scanning type electronic microscope. The result is shown in FIG. 1D. No oxidation film exists on the wafer surface or between the single crystals and the wafer. Then, when ultrasonic vibrations (vibration frequency: 39 KHz, intensity: 300 W) are applied to the wafer immersed in pure water, the single crystals are separated from the wafer for every location a (FIG. 1E). After the removed single crystals are again dried, the reverse sides thereof (the portions which have been in contact with the wafer) are observed by an optical microscope and a scanning type electronic microscope. The result is that while there are still some portions on which the oxidation film partially remains, most of the oxidation film has been etched and the silicon crystals are exposed.

Experiment 3. Transplanting to a Metal Substrate

After the remaining oxidation film on the reverse side is removed by a buffered HF solution and dried, the single crystal grains are spread over a flat chromium substrate and are observed by an optical microscope. The result is that 85% of the total number of crystal grains are settled, their <100> direction facing upward. In other words, the same setting orientation as in the case of growth on a silicon wafer (FIG. 1D) is obtained. In this state, ultrasonic vibrations (vibration frequency: 39 KHz, intensity: 80 W) are given to the chromium substrate. As a result, the percent of crystal grains with their <100> direction facing upward is increased to 94%.

Subsequently, this chromium substrate is annealed at 1,300° C. in a vacuum for two hours. Then, it is found that the single crystal grains have been fixed onto the chromium substrate. The fixed single crystals are then mechanically removed, and a component analysis is made of the reverse side thereof. It is found that an alloy of Si - Cr has been formed on the surface layer thereof.

Experiment 4. Selective Crystal Growth on a Metal Substrate

Using the chromium substrate with the single crystals fixed thereon, which is obtained in Experiment 3, a selective epitaxial crystal growth is attempted. Prior to growth, the substrate is annealed in an oxygen atmosphere at approximately 1,000° C. in order to obtain a non-nucleus forming surface, and an oxidation film ($Cr_xO_y$), is formed on the exposed chromium surface. After the oxidation film ($SiO_2$) of the single crystals is removed by a buffered HF solution and dried, the selective epitaxial crustal growth is performed with the single crystals as the seed crystals, as in Experiment 1. Then, a continuous thin film is obtained. The growth conditions at that time are shown in Table 3.

TABLE 3

| Glass flow ratio (l/min) | $SiH_2Cl_2/HCl/H_2$ = 0.53/2.0/100 |
|---|---|
| Substrate temperature (°C.) | 1,060 |
| Pressure (Torr) | 100 |
| Growth time (min) | 120 |

After completion of the growth, the surface condition is observed by an optical microscope, and is found to be a polycrystalline film having an average grain diameter of approximately 50 μm. Also, by X-ray diffraction, the crystal orientations are examined with the result that unlike the polycrystal silicon formed by the conventional LPCVD, this film is extremely strongly orientated in the <100> direction.

Experiment 5. Formation of a Solar Cell

On the surface of the polycrystals on the chromium substrate obtained in Experiment 4, 20 KeV boron (B) ions are implanted by ion implantation at a flux of $1\times10^-cm^{-2}$, and the resultant is annealed at 800° C. for 30 min to form a P+ layer. Then, the I-V properties of a solar cell having a structure of P+/polycrystal silicon/Cr thus fabricated are measured under light irradiation of AM 1.5 (100 mW/cm$^2$). As a result, in a cell area of 0.16 cm$^2$, the open circuit voltage was 0.38 V, short circuit photoelectric current, 20 mA/cm$^2$, fill factor, 0.68, and a conversion efficiency of 5.2% was obtained. Thus, it was verified that using the (100) orientated polycrystalline silicon thin film formed on the metal substrate, an excellent solar cell can be fabricated.

As the raw material gas which is used for selective crystal growth according to the present invention, $SiH_2Cl_2$, $SiCl_4$, $SiH_3Cl_3$, $SiH_4$, $Si_2H_6$, $SiH_2F_2$, $Si_2F_6$ and other silanes and halogenated silanes are typical, for example.

As a carrier gas, or for the purpose of obtaining the reducing atmosphere which promotes crystal growth, $H_2$ is added to the aforesaid raw material gas. The ratio between the amounts of the aforesaid raw material gas and hydrogen is appropriately determined as desired in accordance with the adopted formation method, the kind of raw material gas, and the material of the insulating layer, as well as the formation conditions. Preferably, however, it is considered appropriate to make the ratio between 1:10 and 1:1,000 (induction flow ratio). More preferably, the ratio should be between 1:20 and 1:800.

In the present invention, HCl is used for the purpose of restraining the generation of nuclei on the insulating layer, and although the amount of HCl added to the raw material gas is determined appropriately as desired in accordance with the formation method, the kind of raw material gas, and the material of the insulating layer and the formation conditions, it is preferable to make the ratio between 1:0.1 and 1:100 and more preferably, between 1:0.2 and 1:80.

As the temperature under which selective crystal growth is performed according to the present invention, while it is varied depending on the formation method, the kind of raw material gas to be used, the ratio between the raw material gas and $H_2$ and HCl, and other formation conditions, appropriate temperatures are between approximately 600° C. and 1,250° C. and more preferably, it should be controlled to be between 650° C. and 1,200° C. in the conventional LPCVD, for example. Also, in a plasma CVD or other low-temperature process, the appropriate temperature should be approximately 200° C. or more and 600° C. or less and more preferably, it should be controlled to be between 200° C. and 500° C.

Likewise, as regards the pressure, between approximately $10^{-2}$ Torr and 760 Torr is appropriate and more preferably, it should be maintained within $10^{-1}$ Torr and 760 Torr.

In a case where a low temperature process such as plasma CVD is adopted as the selective crystal growth method, auxiliary energy is provided in addition to the thermal energy given to the substrate for the purpose of promoting the decomposition of the raw material gas or the crystal growth on the substrate surface. For example, in plasma CVD, a high-frequency energy is used, while in photo CVD, ultraviolet energy is used. As to the intensity of the auxiliary energy, although it depends on the formation method and formation conditions, a high-frequency discharging power of between 20 W and 100 W is appropriate if high-frequency energy is employed, and for ultraviolet energy, an energy density of between 20 mW/cm$^2$ and 500 mW/cm$^2$ is appropriate, and more preferably, it should be controlled to be between 30 W and 100 W for high-frequency discharging power and between 20 mW/cm$^2$ and 400 mW/cm$^2$ for ultraviolet density.

Also, as to the metal substrate which is used for a solar cell according to the present invention, a substrate is selected which is capable of forming a compound with silicon such as a silicide and on the surface of which an oxidation layer can be provided, but it is not limited to such a substrate. Any other kind of substrate may be applicable if a metal having the above-mentioned properties is formed on the surface thereof.

Also, there is no particular limitation to the layer structure of a solar cell according to the present invention. As represented by the experimental examples and the embodiment, the present invention is applicable to a Schottky type, MIS type, pn junction type, pin junction type, hetero junction type, tandem type or any other structural type.

As the insulating layer which is formed on the silicon wafer for growing the seed crystals for a solar cell of the present invention, a material, having a considerably small density of nucleation on its surface as compared with that of silicon, is used for restraining the generation of nuclei while the selective crystals are being selectively grown. For example, SiO$_2$, Si$_3$N$_4$ or the like is used as a typical material.

When the selective crystal growth method, which is used as a method for manufacturing solar cells according to the present invention is performed, there is no particular restriction on the shape of the opening to be provided on the insulating layer. For example, a square or circular opening can be cited as typical ones. As to the size of the opening, it is preferable to make the size to be several $\mu$m or less for restraining the deformation of the facets as well as for making the removal easy, because as represented by the Experiment 1, there is a tendency that the facet of a growing angular single crystal is more deformed as the size of the opening becomes larger, i.e., there is a tendency that the crystallization becomes inferior with a larger opening. In practice, its size depends on the accuracy of the photolithography pattern. It is, therefore, appropriate to make a to be between 1 $\mu$m and 5 $\mu$m if the shape is square. Also, it is appropriate to make the interval b between the openings between 10 $\mu$m and 200 $\mu$m in consideration of the size of the seed crystal to be grown.

For the etching solution which is used for removing the seed crystals from the wafer, any solution is usable as long as such a solution is usually employed for etching SiO$_2$, Si$_3$N$_4$ or the like. It is particularly preferable to use an HF solution or thermophosphatic solution for the purpose.

The vibration frequency of the ultrasonic transducer which is used for adding ultrasonic vibrations should preferably be between 20 KHz and 100 KHz with a preferable intensity of between 20 W and 600 W.

The polycrystalline thin film fabricated by the method according to the present invention enables a junction to be formed by doping it with an impurity element while the crystal is being grown or after its growth.

For the impurity element to be used, an element chosen from Group III of the periodic table, such as B, Al, Ga, or In is suitable for use as a p type impurity while an element chosen from Group V of the periodic table, such as P, As, Sb, or Bi is suitable for use as an n type impurity. Particularly, B, Ga, P, or Sb is most suitable. The amount of the impurity to be used for doping can be determined appropriately in accordance with the desired electrical properties.

For the substance containing an impurity element such as above, it is preferable to select a compound which is gaseous at room temperature under atmospheric pressure or which can be easily vaporized.

As such compounds, there can be named, for example, PH$_3$, P$_2$H$_4$, PF$_3$, PF$_5$, PCl$_3$, AsH$_3$, AsF$_3$, AsF$_5$, AsCl$_3$, SbH$_3$, SbF$_5$, BF$_3$, BCl$_3$, BBr$_3$, B$_2$H$_6$, B$_4$H$_{10}$, B$_4$H$_{12}$, B$_5$H$_9$, B$_5$H$_{11}$, AlCl$_3$ and others. Here, it is possible to use a single compound containing the impurity element or two compounds or more in combination.

Detailed description will now be made of the formation of a desired solar cell by implementing a method according to the present invention. However, it is to be understood that the present invention is not limited by the embodiments set forth below.

Embodiment 1

Figure 3A:
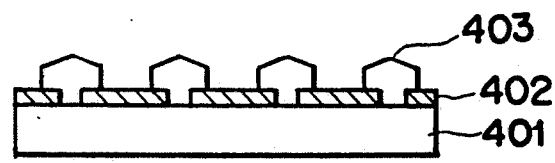
FIGS. 3A to 3F are views illustrating the manufacturing process of an MIS type solar cell fabricated by a method according to the present invention.
Figure 3B:

An MIS type solar cell having polycrystal silicon with the regular crystal orientation is fabricated by the process shown in FIGS. 3A through 3F. For the substrate for growing the single crystals, an Sb doped (100) silicon wafer 401 ($\rho=0.02$ $\Omega$.cm) is used. A thermal oxidation film (200Å) is used as an insulating layer 402, and the openings are provided with a=1.2 $\mu$m and at intervals b=50 $\mu$m. Selective crystal growth is performed by a conventional LPCVD process under conditions shown in Table 1 to form single crystal silicon facets 403 (as shown in FIG. 2B) on the silicon wafer (FIG. 3A).

Figure 3C:
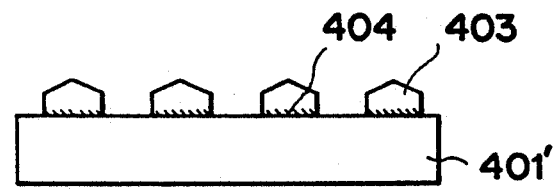
Figure 3D:
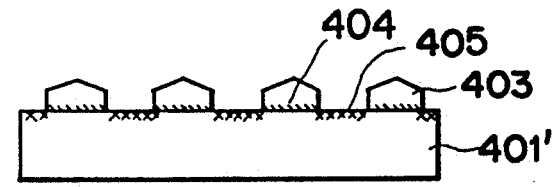
Figure 3E:
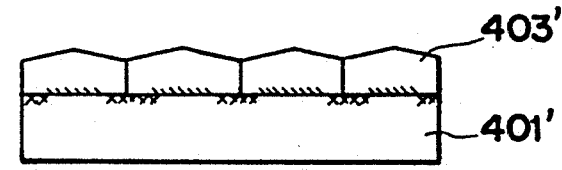
Figure 3F:
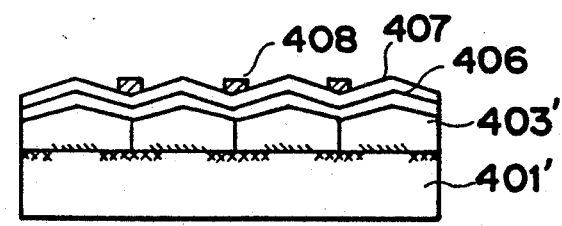

Subsequently, the wafer is immersed in a 49% HF solution for 24 hours, the oxidation film layer 402 is removed by etching, and the single crystal silicon facets 403 are separated from the wafer (FIG. 3B) by ultrasonic vibrations (vibration frequency: 39 KHz and intensity: 200 W) in pure water, subsequent to the wafer having been washed by flowing water. After the separated single crystal silicon facets 403 are dried, the single crystal silicon facets 403 are spread over a chromium substrate 401' of 0.8 mm thickness, and are annealed at approximately 1,300° C. (FIG. 3C) in an inert gas atmosphere subsequent to application of ultrasonic vibrations (vibration frequency: 39 KHz and intensity: 80 W) to the substrate. Then, an annealing is performed at approximately 1,000° C. in an oxygen atmosphere to form an oxidation film on the chromium substrate surface. In FIG. 3C 404 denotes a silicon-metal intermediate layer produced by a reaction between a silicon 403 and a Cr substrate 401' in annealing. In FIG. 3D 405 denotes a metal oxide layer produced by oxidizing the Cr substrate surface in annealing within an oxidizing atmosphere. Subsequent to removal of SiO2 on the single crystal surface by an HF solution (FIG. 3D), selective crystal growth is performed under growth conditions shown in Table 3 to obtain a continuous polycrystalline silicon film 403' (FIG. 3E). An SiO2 layer 406 of 10Å thickness is then deposited on the polycrystal silicon film 403' at 250° C. by LPCVD, and on such a layer, an Au layer which forms a Schottky barrier is deposited as an electrode 407 by vacuum deposition to a thickness of 30Å on the SiO2 layer 406, and further thereon, a patterned layer of Cr 408 is deposited by vacuum deposition at a thickness of 1 μm as a collecting electrode (FIG. 3F).

In regard to the I-V properties of the MIS type solar cell thus obtained, a measurement was performed under light irradiation of AM 1.5. The cell area was 016 cm$^2$. As compared with the properties of a solar cell (cell area 0.16 cm$^2$) having a conventional polycrystalline silicon film (grain diameter 100 μm or less) with irregular crystal orientation, it was found that the conversion efficiency of the MIS type solar cell of the present invention is 5.05% whereas that of the solar cell using the usual polycrystalline film is 4.2%, and that the polycrystalline solar cell according to the present invention has a better performance than the conventional polycrystalline solar cell using the irregular crystal orientation.

Embodiment 2

In the same way as embodiment 1, an amorphous silicon carbide/polycrystal silicon hetero type solar cell is fabricated. For the substrate for growing the single crystals, an Sb doped (100) silicon wafer ($\rho = 0.02$ Ω.cm) is used, and an SiO2 film 502 is deposited to a thickness of 300 Å by atmospheric pressure CVD. The openings are provided with a=1.2 μm and the interval b=50 μm. Selective crystal growth is performed by a conventional LPCVD under conditions shown in Table 4 to form single crystal silicon facets having regular crystal orientation. The process whereby the hetero type solar cell is fabricated is shown in FIGS. 5A through 5F. The process is almost the same as embodiment 1 as shown in FIG. 3 with the exception of FIG. 5F where p type amorphous silicon carbide 506 is formed instead of the oxidation film 406 and a transparent conductive film 507 is also formed instead of the barrier electrode 407 sequentially on the polycrystalline silicon.

TABLE 4

| Glass flow ratio (l/min) | SiH2Cl2/HCl/H2 = 0.6/2.0/100 |
|---|---|
| Substrate temperature (°C.) | 950 |
| Pressure (Torr) | 100 |
| Growth time (min) | 40 |

The p type amorphous silicon carbide layer 506 is deposited on the polycrystalline silicon surface by conventional plasma CVD process to a thickness of 100Å under the conditions shown in Table 5. The dark conductivity ratio of the amorphous silicon carbide film is $10^{-2}$ s . cm$^{-1}$ or less and the composition ratio between C and Si in the SiC film is 2:3.

TABLE 5

| Glass flow ratio | SiH4/CH4 = 0.8 (cc/min)/0.2 (cc/min) B2H6/S6H4 = 1.5 × 10$^{-2}$ |
|---|---|
| Substrate temperature (°C.) | 350 |
| Pressure (Torr) | 0.5 |
| Discharging power (W) | 8 |

Also, the transparent conductive film 507 is formed by depositing ITO of approximately 1,000Å thickness by electron beam deposition.

The I-V properties of the amorphous silicon carbide/polycrystal silicon hetero type solar cell thus obtained (cell area 0.16 cm$^2$) were measured under light irradiation of AM 1.5. The results were: open circuit voltage 0.49 V, short circuit photoelectric current 19.5 mA/cm$^2$, fill factor 0.53, and the conversion efficiency was as high as 5.1%. This is an excellent achievement as compared with the conventional amorphous silicon carbide/polycrystal silicon hetero type solar cell using irregularly oriented crystals.

Embodiment 3

Figure 6:
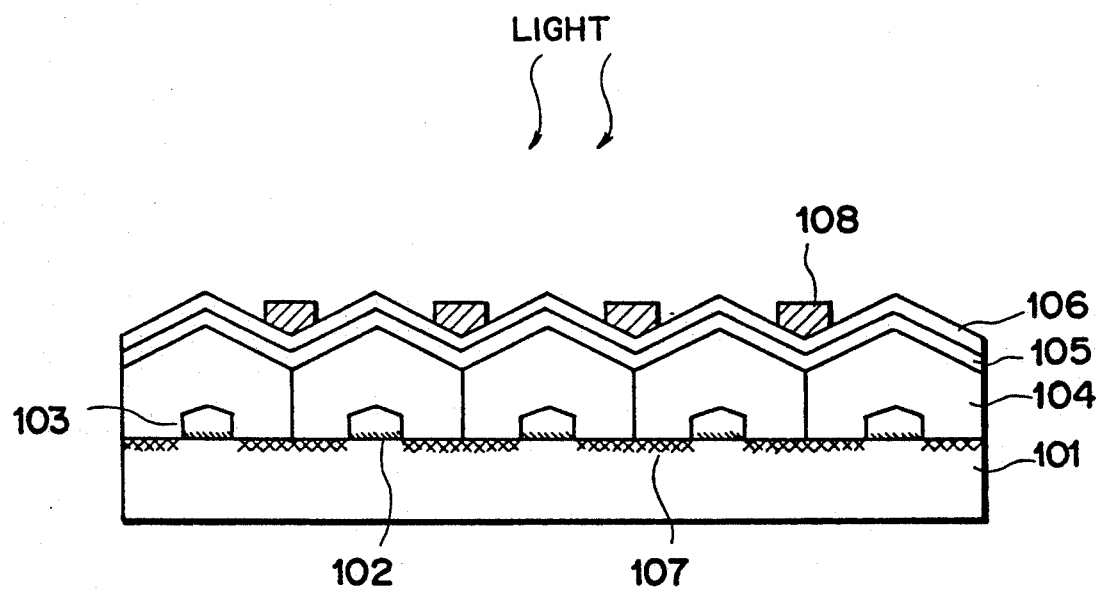
FIG. 6 is a cross-sectional view showing a pin type solar cell fabricated by a method according to the present invention.
Figure 7A:
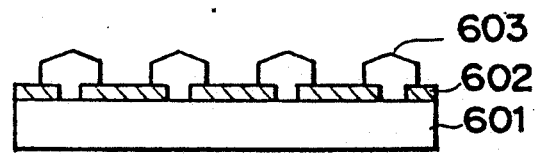
FIGS. 7A to 7F are views illustrating the manufacturing process of the pin type solar cell fabricated by a method according to the present invention.
Figure 7B:
Figure 7C:
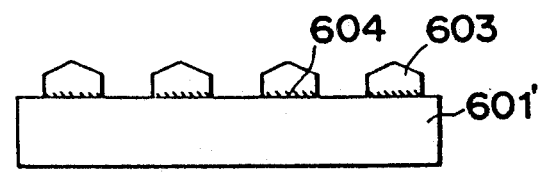
Figure 7D:
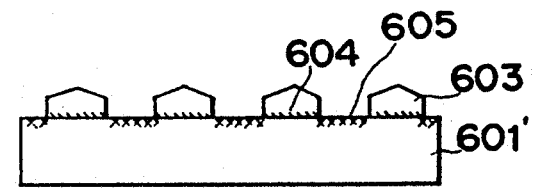
Figure 7E:
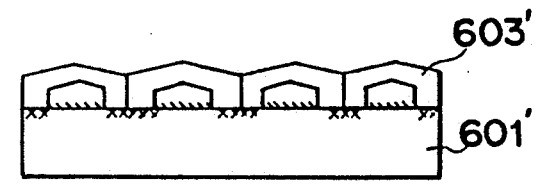
Figure 7F:
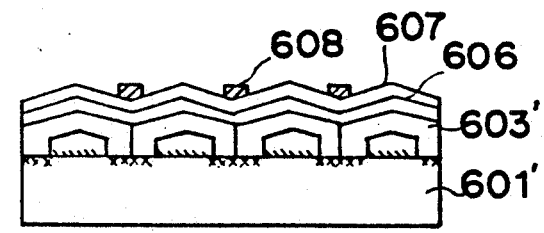

In the same way as embodiments 1 and 2, a pin type polycrystalline solar cell as shown in FIG. 6 is fabricated. The pin junction is produced in the single crystal by adding a small quantity of dopant impurity to the raw material gas while the selective crystal growth is in progress.

The SiO2 is deposited by LPCVD to a thickness of 300Å. The size of the openings is a=1.2 μm while the interval b=50 μm. While the single crystals are growing, the kind of dopant impurity is sequentially varied by the selective crystal growth method to form the junction. The growth conditions are shown in Table 6.

The impurity selection is such that PH3 is introduced until the single crystals have grown to approximately 20 μm to form an n layer, the signal crystals are separated from the nucleating substrate and fixed to the metal substrate, and selective crystal growth is performed without any introduction of impurity subsequent to the oxidation film having been formed, and then, B2H6 is introduced to form a p layer of 0.2 μm thickness when the continuous polycrystalline thin film has been formed.

TABLE 6

|  | p$^+$ Si layer | i Si layer | n$^+$ Si layer |
|---|---|---|---|
| SiH2Cl2 (l/min) | 0.6 | 0.53 | 0.53 |
| HCl (l/min) | 2.0 | 2.2 | 2.2 |
| H2 (l/min) | 100 | 100 | 100 |
| PH3/SiH2Cl2 (ppm) | 0 | 0 | 6,000 |
| B2H6/SiH2Cl2 (ppm) | 4,000 | 0 | 0 |
| Substrate temperature (°C.) | 1,060 | 1,060 | 950 |
| Reaction pressure (Torr) | 80 | 80 | 80 |

For the metal substrate, molybdenum is used, and the annealing for fixing the single crystals is performed at 530° C. while the annealing for forming the oxidation film is performed at 1,000° C. in an oxygen atmosphere. Thus, a solar cell having a pin junction is fabricated in the process shown in FIGS. 7A through 7F.

The I-V properties of a pin junction type polycrystalline solar cell of area 0.16 cm² fabricated through the above-mentioned process were measured under light irradiation of AM 1.5. The results were: a high conversion efficiency of 7.2% is obtained with the open circuit voltage being 0.47 V, short circuit photo electric current, 23 mA/cm²; and fill factor, 0.67.

Embodiment 4

In the same way as in embodiments 1 through 3, an nip type polycrystalline solar cell is fabricated. For the substrate for growing the single crystals, a boron (B) doped (100) silicon wafer ($\rho = 1$ Ω. cm) is used and a SiO₂ film of 300Å thickness is deposited by atmospheric pressure CVD. The size of the openings is $a = 1.2$ μm and the intervals $b = 50$ μm. By a conventional LPCVD process, selective crystal growth is performed under conditions shown in Table 4 to form the silicon crystals having the regulated crystal orientation. Over a molybdenum substrate with 200Å of Al deposited on its surface by vacuum deposition, the single crystals are spread subsequent to being separated from the wafer and annealed at 585° C. In this case, when the single crystals thus separated from the wafer are fixed to the substrate by annealing eutectic reaction is generated between the Al and the single crystal Si, and an Al - Si intermediate layer (p⁺ layer) is formed.

Subsequently, an annealing is performed at 850° C. in an oxygen atmosphere, and a further annealing is performed at 1,100° C. in an inert gas after having formed the oxidation film on the exposed Al surface. The SiO₂ on the single crystal surfaces is removed by an HF solution. Then, as in embodiment 3, selective crystal growth is performed without introducing any dopant impurity, and when a continuous polycrystalline thin film is formed, PH₃ is introduced to form an n layer of 0.2 μm thickness on the polycrystalline thin film. The formation conditions of the i layer and the n layer are the same as those shown in Table 6. Subsequent to the formation of the polycrystalline film, approximately 1,000Å of ITO is deposited as a transparent conductive film by an electron beam deposition, and further thereon, 1 μm Cr is deposited by a vacuum deposition as a collecting electrode.

The I-V properties of the nip junction type polycrystalline solar cell of 0.16 cm² cell area thus fabricated were measured under light irradiation of AM 1.5. The results were: conversion efficiency of 7.9% with an open circuit voltage 0.46 V; short circuit photoelectric current 25 mA/cm²; and fill factor, 0.69.

According to the present invention set forth above, it is possible to manufacture a high-efficiency thin fill type solar cell by regulating in the film thickness direction the crystal orientation of the crystal grains which are the main component of the polycrystalline silicon thin film.

Also, it is possible to manufacture low-cost solar cells in a large scale because angular single crystals formed on a silicon wafer by a selective epitaxial method can be removed and transplanted onto a metal substrate, and a polycrystalline thin film can be obtained on the metal substrate by selectively growing these single crystals as seed crystals, and further because the wafer can be reused many times.

Moreover, according to the present invention, a polycrystalline thin film solar cell of excellent characteristics can be formed on a metal substrate, thus making it possible to provide thin fill type solar cells capable of mass production in a desirable quality at low cost for the market.

What is claimed is:

1. A method for manufacturing polycrystalline solar cells comprising the sequential steps of:

arranging a plurality of single silicon crystals having regulated crystal orientation on a metal substrate at desired intervals;

forming a metal-silicon intermediate layer between said metal substrate and said single silicon crystals by applying heat;

oxidizing the exposed surface portions of said metal substrate; and performing crystal growth by a selective epitaxial growing method with said single silicon crystals as seed crystals.

2. A method for manufacturing polycrystalline solar cells according to claim 1, wherein said method comprises the steps of preliminarily:

forming an insulating layer on a surface of a silicon wafer;

forming a plurality of spaced apart fine openings in said insulating layer;

forming single silicon crystals in said openings by a selective epitaxial growth method;

removing said insulating layer by etching;

separating said single silicon crystals from said silicon wafer by ultrasonic vibrations; and arranging said separated silicon crystals on said metal substrate.

3. A method for manufacturing polycrystalline solar cells according to claim 1, wherein ultrasonic vibrations are applied when said single silicon crystals are arranged on said metal substrate.

4. A method for producing a semiconductor article, comprising the sequential steps of:

forming a plurality of single crystal semiconductor bodies on a semiconductor substrate by a selective growth method;

separating said bodies from said substrate;

arranging said bodies on a conductive surface of a substrate at desired intervals, wherein the crystal orientation of said bodies is regulated;

performing crystal growth by a selective epitaxial growth method with said bodies as seed crystals.

5. A method for manufacturing a polycrystalline solar cell, comprising the sequential steps of:

arranging single silicon crystals having regulated crystal orientation on a metal substrate at desired intervals;

forming a metal-silicon intermediate layer between said metal substrate and said single silicon crystals by heating;

oxidizing the exposed surface portions of said metal substrate; and performing crystal growth by a selective epitaxial growth method with said single silicon crystals as seed crystals.

6. A method for manufacturing polycrystalline solar cells according to claim 5, wherein said method comprises the steps of preliminarily:

forming an insulation layer on a silicon wafer;

forming a plurality of spaced apart fine openings in said insulating layer;
forming single silicon crystals in said openings by a selective epitaxial growth method;
removing said insulating layer by etching;
separating said single silicon crystals from said silicon wafer by ultrasonic vibrations; and
arranging said single silicon crystals on said metal substrate.

7. A method for manufacturing polycrystalline solar cells according to claim 5, wherein
ultrasonic vibrations are applied when said single silicon crystals are arranged on said metal substrate.

* * * * *

UNITED STATES PATENT AND TRADEMARK OFFICE
CERTIFICATE OF CORRECTION

PATENT NO. : 5,254,481
DATED : October 19, 1993
INVENTOR(S) : SHOJI NISHIDA

It is certified that error appears in the above-identified patent and that said Letters Patent is hereby corrected as shown below:

COLUMN 3

Line 26, "over growth," should read --overgrowth,--.
   Line 30, "performing" should read --by performing--.
   Line 68, "to on" should read --to--.

COLUMN 4

Line 2, "shown" should read --as shown--.
   Line 49, "and" should be deleted.
   TABLE 1, "Glass flow" should read --Gas flow--.

COLUMN 6

Line 2, "crustal" should read --crystal--.
   TABLE 3, "Glass flow" should read --Gas flow--.
   Line 26, "1x10-cm$^{-2}$," should read --1x10$^{15}$cm$^{-2}$,--.

COLUMN 9

Line 27, "016 cm$^2$." should read --0.16 cm$^2$.--.
   Line 41, "embodiment 1," should read --Embodiment 1,--.
   Line 53, "embodiment 1," should read --Embodiment 1,--.
   TABLE 4, "Glass flow" should read --Gas flow--.

COLUMN 10

TABLE 5, "Glass flow" should read --Gas flow--.
   Line 27, "embodiments" should read --Embodiments--.
   Line 41, "signal" should read --single--.
   TABLE 6, insert heading --Growth Conditions--.

UNITED STATES PATENT AND TRADEMARK OFFICE
CERTIFICATE OF CORRECTION

PATENT NO. : 5,254,481
DATED : October 19, 1993
INVENTOR(S) : SHOJI NISHIDA

It is certified that error appears in the above-indentified patent and that said Letters Patent is hereby corrected as shown below:

COLUMN 11

Line 13, "embodiments" should read --Embodiments--.
    Line 28, "annealing" should read --annealing,--.
    Line 36, "embodiment 3," should read --Embodiment 3,--.
    Line 55, "fill" should read --film--.

COLUMN 12

Line 4, "fill" should read --film--.
    Line 9, "cells" should read --cells,--.
    Line 68, "insulation" should read --insulating--.

Signed and Sealed this

Twenty-sixth Day of July, 1994

Attest:

BRUCE LEHMAN

*Attesting Officer*   *Commissioner of Patents and Trademarks*